(12) United States Patent
Chrislip et al.

(10) Patent No.: US 6,599,441 B1
(45) Date of Patent: Jul. 29, 2003

(54) CRYSTALLIZATION SOLUTIONS

(75) Inventors: Mary Ann Chrislip, Fredericksburg, VA (US); Bart Staker, Silverdale, WA (US)

(73) Assignee: Emerald BioStructures, Inc., Bainbridge Island, WA (US)

( * ) Notice: Subject to any disclaimer, the term of this patent is extended or adjusted under 35 U.S.C. 154(b) by 0 days.

(21) Appl. No.: 09/898,907

(22) Filed: Jul. 3, 2001

Related U.S. Application Data

(60) Provisional application No. 60/219,016, filed on Jul. 18, 2000.

(51) Int. Cl.⁷ ............................. B01D 9/00; G01N 31/00
(52) U.S. Cl. ........................................ 252/245.1; 436/4
(58) Field of Search ............................... 422/245.1, 252, 422/253; 436/4, 15

(56) References Cited

U.S. PATENT DOCUMENTS

| | | | |
|---|---|---|---|
| 5,419,278 A | * | 5/1995 | Carter .................... 117/206 |
| 6,039,804 A | * | 3/2000 | Kim et al. ................ 117/206 |
| 6,267,935 B1 | * | 7/2001 | Hol et al. ............... 422/245.1 |

* cited by examiner

*Primary Examiner*—Benjamin L. Utech
*Assistant Examiner*—Matthew Anderson
(74) *Attorney, Agent, or Firm*—Christensen O'Connor Johnson Kindness PLLC

(57) ABSTRACT

In one aspect, the present invention provides sets of crystallization solutions that each comprise a crystallization solution set selected from the group of crystallization solution sets consisting of Crystallization Solution Set 1, Crystallization Solution Set 2, Crystallization Solution Set 3, Crystallization Solution Set 4 and Crystallization Solution Set 5. In another aspect, the present invention provides kits that each comprise at least one crystallization plate and a Crystallization Solution Set of the invention.

17 Claims, 1 Drawing Sheet

CRYSTALLIZATION SOLUTIONS

RELATED APPLICATIONS

This application claims benefit of priority from U.S. Provisional Patent Application Serial No. 60/219,016, filed on Jul. 18, 2000.

FIELD OF THE INVENTION

The present invention relates to solutions that are useful for crystallizing molecules, especially macromolecules such as proteins.

BACKGROUND OF THE INVENTION

Macromolecular X-ray crystallography is an essential tool in modern drug discovery and molecular biology. Using X-ray crystallographic techniques, the three-dimensional structures of biological macromolecules, such as proteins, nucleic acids, and their various complexes, can be determined at practically atomic-level resolution from X-ray diffraction data.

One of the first and most important steps in the X-ray crystal structure determination of a target macromolecule is to grow large, well-diffracting crystals of the macromolecule. As the techniques for collecting and analyzing X-ray diffraction data have become more rapid and automated, crystal growth has become a rate-limiting step in the structure determination process.

Vapor diffusion is the most widely used technique for crystallization in modem macromolecular X-ray crystallography. In this technique, a small volume of the macromolecule sample is mixed with an approximately equal volume of a crystallization solution. The resulting drop of liquid (containing macromolecule and dilute crystallization solution) is sealed in a chamber with a much larger reservoir volume of the crystallization solution. The drop is kept separate from the reservoir of crystallization solvent either by hanging the drop from a glass cover slip or by sitting the drop on a pedestal above the level of the solvent in the reservoir. Over time, the crystallization drop and the reservoir solutions equilibrate via vapor diffusion of volatile chemical species. Supersaturating concentrations of the macromolecule are achieved, resulting in crystallization of the macromolecule sample in the drop.

Lipidic cubic phase (LCP) is a relatively new technique which has been successful in crystallizing integral membrane proteins. Typically, membrane proteins are very hydrophobic, and tend to aggregate amorphously instead of forming well-ordered three-dimensional crystals. In the LCP technique, the protein samples are mixed with a lipid to form a gel-like emulsion of protein and lipid. The lipid in this emulsion forms a cubic, three-dimensional, lattice in which the hydrophobic membrane proteins can form three-dimensional crystals. To set up LCP crystallizations, a portion of LCP emulsion, containing the protein and lipid, is dispensed into a reservoir of crystallization solution. The LCP emulsion must remain as a distinct, separate, phase from the aqueous crystallization solution during the crystallization experiment. Consequently, crystallization solutions used in LCP experiments should not dissolve the LCP emulsion of protein and lipid.

The process of growing biological macromolecule crystals remains a highly empirical process. Macromolecular crystallization is dependent on a host of experimental parameters, including; pH, temperature, the concentration of salts in the crystallization drop, the concentration of the macromolecule to be crystallized, and the concentration of the precipitating agent (of which there are hundreds). In particular, the choice of solute conditions in which to grow crystals continues to be a matter for empirical determination. Consequently, the ability to rapidly and easily generate many crystallization trials is important in determining the ideal conditions for crystallization. Thus, there is a need for sets of preformulated crystallization solutions that can be used to rapidly and easily generate many crystallization trials. More specifically, there is a need for sets of crystallization solutions that can be used to generate numerous LCP crystallization trials.

SUMMARY OF THE INVENTION

In one aspect, the present invention provides sets of crystallization solutions useful, for example, for crystallizing molecules, such as proteins and other macromolecules. The crystallization solution sets are identified herein as Crystallization Solution Set 1, Crystallization Solution Set 2, Crystallization Solution Set 3, Crystallization Solution Set 4, and Crystallization Solution Set 5. The composition of Crystallization Solution Sets 1–5 are set forth in Tables 1–5 herein.

Thus, in one aspect, the present invention provides sets of crystallization solutions that each comprise a crystallization solution set selected from the group of crystallization solution sets consisting of Crystallization Solution Set 1, Crystallization Solution Set 2, Crystallization Solution Set 3, Crystallization Solution Set 4, and Crystallization Solution Set 5.

In another aspect, the present invention provides kits that each comprise at least one crystallization plate and a set of crystallization solutions comprising a set of crystallization solutions selected from the group of crystallization solutions sets consisting of Crystallization Solution Set 1, Crystallization Solution Set 2, Crystallization Solution Set 3, Crystallization Solution Set 4, and Crystallization Solution Set 5. In some embodiments of the kits of the invention, the crystallization solutions of the Crystallization Solution Set(s) are disposed within the reservoirs of the crystallization plate(s). The presently preferred crystallization plates for inclusion in the kits of the invention are disclosed in U.S. patent application Ser. No. 09/150,629 (now U.S. Pat. No. 6,039,804), incorporated herein by reference.

Thus, the present invention provides Crystallization Solution Sets and kits that permit a large number of crystallization conditions to be simultaneously tested in order to identify crystallization conditions under which a molecule, especially a biological macromolecule, such as a protein, can be crystallized. The crystallization solutions of the solution sets of the invention can be used in LCP crystallization experiments because they do not dissolve the LCP emulsion of protein and lipid.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
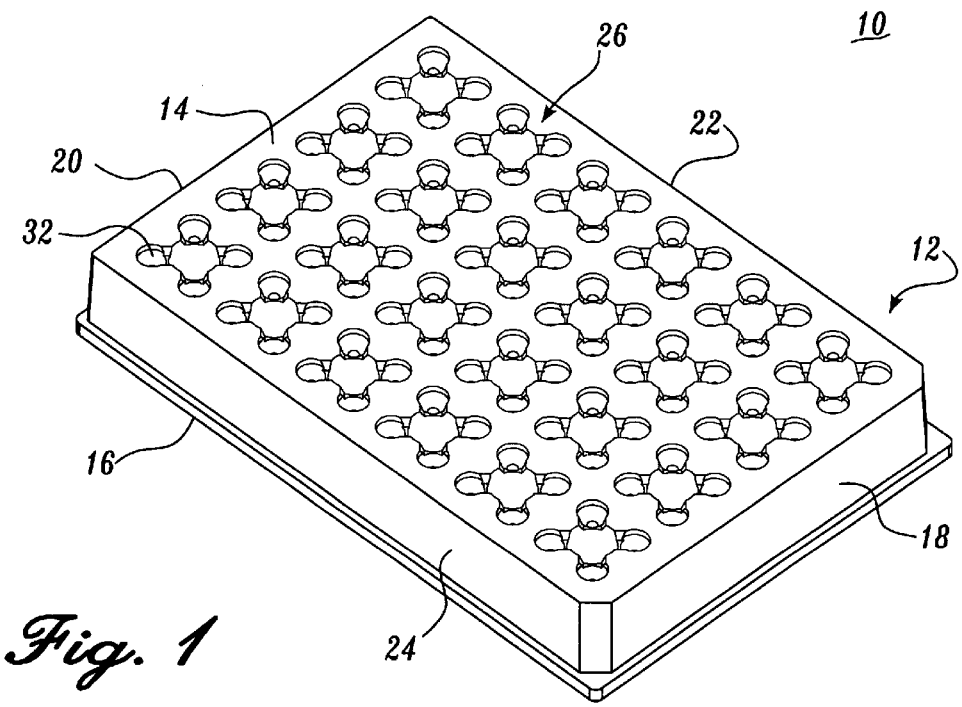
FIG. 1 is a three-dimensional view of a presently preferred crystallization plate useful for inclusion in a kit of the present invention.

In one aspect, the present invention provides sets of crystallization solutions, each crystallization solution set comprising a crystallization solution set selected from the group of crystallization solution sets consisting of Crystallization Solution Set 1, Crystallization Solution Set 2, Crystallization Solution Set 3, Crystallization Solution Set 4, and Crystallization Solution Set 5. The compositions of the individual solutions that constitute Crystallization Solution Sets 1–5 are set forth in Tables 1–5.

The following abbreviations are used: CAPS, 3-(cyclohexylamino)-1-propanesulfonic acid; CHES, 2-(N-cyclohexylamino)ethanesulfonic acid; EG, ethylene glycol; HEPES, N-(2-hydroxyethyl)piperazine-N'-(2-ethanesulfonic acid); MES, 2-(N-morpholino)ethanesulfonic acid; MME, monomethyl ether; NaMal, sodium malonate; Ac, acetate; PEG, polyethylene glycol; Tris, tris(hydroxymethyl)aminomethane.

TABLE 1

Crystallization Solution Set 1

| Solution | Compound Buffer | Precipitant | Salt |
|---|---|---|---|
| 1 | 100.000 mM HEPES/NaOH pH: 7.5 | 10.000% v/v isopropanol | 200.000 mM sodium chloride |
| 2 | 100.000 mM $Na_3$ citrate/citric acid pH: 5.5 | 20.000% w/v PEG-3000 | |
| 3 | 100.000 mM MES/NaOH pH: 6. | 10.000% w/v PEG-8000 | 200.000 mM $ZnAc_2$ |
| 4 | 100.000 mM $Na_3$ citrate/citric acid pH: 5.5 | 2000.000 mM $(NH_4)_2$ sulfate | |
| 5 | 100.000 mM Tris base/HCl pH: 7. | 20.000% w/v PEG-2000 MME | |
| 6 | 100.000 mM MES/NaOH pH: 6. | 20.000% v/v 1,4-butanediol | 200.000 mM $Li_2$ sulfate |
| 7 | 100.000 mM imidazole/HCl pH: 8. | 20.000% w/v PEG-1000 | 200.000 mM $CaAc_2$ |
| 8 | 100.000 mM $Na_2$ H phosphate/K $H_2$ phosphate pH: 6.2 | 2500.000 mM sodium chloride | |
| 9 | 100.000 mM acetic acid/NaAc pH: 4.5 | 30.000% w/v PEG-8000 | 200.000 mM $Li_2$ sulfate |
| 10 | 100.000 mM Tris base/HCl pH: 8.5 | 10.000% v/v isopropanol | |
| 11 | 100.000 mM Tris base/HCl pH: 8.5 | 30.000% v/v PEG-400 | 200.000 mM $MgCl_2$ |
| 12 | 100.000 mM imidazole/HCl pH: 8. | 2500.000 mM sodium chloride | |
| 13 | 100.000 mM MES/NaOH pH: 6. | 10.000% v/v isopropanol | 200.000 mM $CaAc_2$ |
| 14 | 100.000 mM Tris base/HCl pH: 7. | 15.000% v/v EtOH | |
| 15 | 100.000 mM acetic acid/NaAc pH: 4.5 | 30.000% v/v PEG-400 | 200.000 mM $CaAc_2$ |
| 16 | 100.000 mM acetic acid/NaAc pH: 4.5 | 20.000% w/v PEG-1000 | 200.000 mM $ZnAc_2$ |
| 17 | 100.000 mM acetic acid/NaAc pH: 4.5 | 10.000% w/v PEG-3000 | 200.000 mM $ZnAc_2$ |
| 18 | 100.000 mM $Na_2$ H phosphate/K $H_2$ phosphate pH: 6.2 | 10.000% w/v PEG-8000 | 200.000 mM sodium chloride |
| 19 | 100.000 mM Tris base/HCl pH: 8.5 | 1000.000 mM $(NH_4)_2$ H phosphate | |
| 20 | 100.000 mM Na cacodylate/HCl pH: 6.5 | 10.000% v/v isopropanol | 200.000 mM $ZnAc_2$ |
| 21 | 100.000 mM Na cacodylate/HCl pH: 6.5 | 30.000% v/v PEG-400 | 200.000 mM $Li_2$ sulfate |
| 22 | 100.000 mM $Na_3$ citrate/citric acid pH: 5.5 | 15.000% v/v EtOH | 200.000 mM $Li_2$ sulfate |
| 23 | 100.000 mM HEPES/NaOH pH: 7.5 | 1260.000 mM $(NH_4)_2$ sulfate | |
| 24 | 100.000 mM Tris base/HCl pH: 7. | 2500.000 mM sodium chloride | 200.000 mM $MgCl_2$ |
| 25 | 100.000 mM MES/NaOH pH: 6. | 15.000% v/v EtOH | 200.000 mM $ZnAc_2$ |
| 26 | 100.000 mM imidazole/HCl pH: 8. | 10.000% v/v isopropanol | |
| 27 | 100.000 mM HEPES/NaOH pH: 7.5 | 15.000% v/v EtOH | 200.000 mM $MgCl_2$ |
| 28 | 100.000 mM Na cacodylate/HCl pH: 6.5 | 10.000% w/v PEG-3000 | 200.000 mM $MgCl_2$ |
| 29 | 100.000 mM MES/NaOH pH: 6. | 20.000% w/v PEG-8000 | 200.000 mM $CaAc_2$ |
| 30 | 100.000 mM CHES/NaOH pH: 9.5 | 1260.000 mM $(NH_4)_2$ sulfate | 200.000 mM sodium chloride |

TABLE 1-continued

Crystallization Solution Set 1

| Solution | Compound Buffer | Precipitant | Salt |
|---|---|---|---|
| 31 | 100.000 mM imidazole/HCl pH: 8. | 20.000% v/v 1,4-butanediol | 200.000 mM $ZnAc_2$ |
| 32 | 100.000 mM Tris base/HCl pH: 7. | 1000.000 mM $Na_3$ citrate | 200.000 mM sodium chloride |
| 33 | 100.000 mM HEPES/NaOH pH: 7.5 | 30.000% v/v PEG-400 | 200.000 mM sodium chloride |
| 34 | 100.000 mM Tris base/HCl pH: 7. | 10.000% w/v PEG-8000 | 200.000 mM $MgCl_2$ |
| 35 | 100.000 mM Na cacodylate/HCl pH: 6.5 | 20.000% w/v PEG-1000 | 200.000 mM $MgCl_2$ |
| 36 | 100.000 mM imidazole/HCl pH: 8. | 2500.000 mM sodium chloride | 200.000 mM $ZnAc_2$ |
| 37 | 100.000 mM $Na_2$ H phosphate/K $H_2$ phosphate pH: 6.2 | 40.000% v/v EG | |
| 38 | 100.000 mM Tris base/HCl pH: 8.5 | 30.000% v/v PEG-200 | 200.000 mM $(NH_4)_2$ H phosphate |
| 39 | 100.000 mM HEPES/NaOH pH: 7.5 | 10.000% v/v glycerol 30.000% v/v PEG-600 | 50.000 mM $Li_2$ sulfate |
| 40 | 100.000 mM HEPES/NaOH pH: 7.5 | 40.000% v/v EG 5.000% w/v PEG-3000 | |
| 41 | 100.00 mM Tris base/HCl pH: 7. | 40.000% v/v EG | |
| 42 | 100.00 mM Tris base/HCl pH: 8.5 | 50.000% v/v EG | 200.000 mM $MgCl_2$ |
| 43 | 100.00 mM Tris base/HCl pH: 8.5 | 5.000% w/v PEG-8000 10.000% v/v glycerol 20.000% v/v PEG-300 | |
| 44 | 100.000 mM acetic acid/NaAc pH: 4.5 | 40.000% v/v PEG-400 | |
| 45 | 100.000 mM Tris base/HCl pH: 7. | 10.000% v/v glycerol 30.000% v/v PEG-600 | 500.000 mM $(NH_4)_2$ sulfate |
| 46 | 100.000 mM HEPES/NaOH pH: 7.5 | 50.000% v/v EG | 200.000 mM $Li_2$ sulfate |
| 47 | 100.000 mM acetic acid/NaAc pH: 4.5 | 30.000% v/v PEG-200 | 100.000 mM sodium chloride |
| 48 | 100.000 mM CAPS/NaOH pH: 10.5 | 30.000% v/v PEG-200 | 200.000 mM $(NH_4)_2$ sulfate |

TABLE 2

Crystallization Solution Set 2

| Solution | Compound Buffer | Precipitant | Salt |
|---|---|---|---|
| 1 | 100.000 mM Tris base/HCl pH: 7. | 10.000% v/v isopropanol | 200.000 mM $ZnAc_2$ |
| 2 | 100.000 mM acetic acid/NaAc pH: 4.5 | 10.000% v/v isopropanol | 200.000 mM $CaAc_2$ |
| 3 | 100.000 mM $Na_3$ citrate/$Na_3$ citrate pH: 5.5 | 10.000% v/v isopropanol | 200.000 mM $Li_2$ sulfate |
| 4 | 100.000 mM Tris base/HCl pH: 7. | 10.000% v/v isopropanol | 200.000 mM $CaAc_2$ |
| 5 | 100.000 mM acetic acid/NaAc pH: 4.5 | 10.000% v/v isopropanol | 200.000 mM sodium chloride |
| 6 | 100.000 mM $Na_3$ citrate/$Na_3$ citrate pH: 5.5 | 10.000% v/v isopropanol | 200.000 mM $MgCl_2$ |
| 7 | 100.000 mM HEPES/NaOH pH: 7.5 | 10.000% w/v PEG-8000 | 200.000 mM sodium chloride |
| 8 | 100.000 mM MES/NaOH pH: 6. | 10.000% w/v PEG-8000 | 200.000 mM $ZnAc_2$ |
| 9 | 100.000 mM $Na_2$ H phosphate/K $H_2$ phosphate pH: 6.2 | 10.000% w/v PEG-8000 | 200.000 mM $Li_2$ sulfate |
| 10 | 100.000 mM acetic acid/NaAc pH: 4.5 | 10.000% w/v PEG-8000 | 200.000 mM $CaAc_2$ |
| 11 | 100.000 mM Tris base/HCl pH: 8.5 | 10.000% w/v PEG-8000 | 200.000 mM $MgCl_2$ |
| 12 | 100.000 mM Na cacodylate/HCl pH: 6.5 | 10.000% w/v PEG-8000 | 200.000 mM sodium chloride |
| 13 | 100.000 mM $Na_3$ citrate/citric acid pH: 5.5 | 10.000% w/v PEG-8000 | 200.000 mM $Li_2$ sulfate |

TABLE 2-continued

Crystallization Solution Set 2

| Solution | Compound Buffer | Precipitant | Salt |
|---|---|---|---|
| 14 | 100.000 mM HEPES/NaOH pH: 7.5 | 10.000% w/v PEG-8000 | 200.000 mM $MgCl_2$ |
| 15 | 100.000 mM HEPES/NaOH pH: 7.5 | 20.000% w/v PEG-2000 MME | 200.000 mM NaCl |
| 16 | 100.000 mM MES/NaOH pH: 6. | 20.000% w/v PEG-2000 MME | 200.000 mM $ZnAc_2$ |
| 17 | 100.000 mM $Na_2$ H phosphate/K $H_2$ phosphate pH: 6.2 | 20.000% w/v PEG-2000 MME 200.00 mM $Li_2$ sulfate | |
| 18 | 100.000 mM acetic acid/NaAc pH: 4.5 | 20.000% w/v PEG-2000 MME | 200.000 mM $CaAc_2$ |
| 19 | 100.000 mM Tris base/HCl pH: 8.5 | 20.000% w/v PEG-2000 MME | 200.000 mM $MgCl_2$ |
| 20 | 100.000 mM cacodylic acid/Na cacodylate pH: 6.5 | 20.000% w/v PEG-2000 MME 200.000 mM $Li_2$ sulfate | |
| 21 | 100.000 mM HEPES/NaOH pH: 7.5 | 20.000% w/v PEG-2000 MME 200.000 mM $Li_2$ sulfate | |
| 22 | 100.000 mM Tris base/HCl pH: 8.5 | 20.000% v/v 1,4-butanediol 200.000 mM $Li_2$ sulfate | |
| 23 | 100.00 mM cacodylic acid/Na cacodylate pH: 6.5 | 20.000% v/v 1,4-butanediol | 200.000 mM $CaAc_2$ |
| 24 | 100.000 mM $Na_3$ citrate/citric acid pH: 5.5 | 20.000% v/v 1,4-butanediol | 200.000 mM $MgCl_2$ |

TABLE 3

Crystallization Solution Set 3

| Solution | Compound Buffer | Precipitant | Salt |
|---|---|---|---|
| 1 | 100.000 mM Tris base/HCl pH: 7. | 20.000% v/v 1,4-butanediol | 200.000 mM $ZnAc_2$ |
| 2 | 100.000 mM Tris base/HCl pH: 8.5 | 20.000% v/v 1,4-butanediol | 200.000 mM $MgCl_2$ |
| 3 | 100.000 mM $Na_3$ citrate/citric acid pH: 5.5 | 20.000% v/v 1,4-butanediol | 200.000 mM sodium chloride |
| 4 | 100.000 mM HEPES/NaOH pH: 7.5 | 20.000% w/v PEG-1000 | 200.000 mM sodium chloride |
| 5 | 100.000 mM MES/NaOH pH: 6. | 20.000% w/v PEG-1000 | 200.000 mM $ZnAc_2$ |
| 6 | 100.000 mM Tris base/HCl pH: 7. | 20.000% w/v PEG-1000 | 200.000 mM $Li_2$ sulfate |
| 7 | 100.000 mM HEPES/NaOH pH: 7.5 | 20.000% w/v PEG-1000 | 200.000 mM $MgCl_2$ |
| 8 | 100.000 mM MES/NaOH pH: 6. | 20.000% w/v PEG-1000 | 200.000 mM sodium chloride |
| 9 | 100.000 mM HEPES/NaOH pH: 7.5 | 2500.000 mM sodium chloride | |
| 10 | 100.000 mM MES/NaOH pH: 6. | 2500.000 mM sodium chloride | 200.000 mM $ZnAc_2$ |
| 11 | 100.000 mM Tris base/HCl pH: 8.5 | 2500.000 mM sodium chloride | 200.000 mM $Li_2$ sulfate |
| 12 | 100.000 mM cacodylic acid/Na cacodylate pH: 6.5 | 2500.000 mM sodium chloride | 200.000 mM $CaAc_2$ |
| 13 | 100.000 mM $Na_3$ citrate/citric acid pH: 5.5 | 2500.000 mM sodium chloride | 200.000 mM $MgCl_2$ |
| 14 | 100.000 mM cacodylic acid/Na cacodylate pH: 6.5 | 2500.000 mM sodium chloride | 200.000 mM $Li_2$ sulfate |
| 15 | 100.000 mM Tris base/HCl pH: 7. | 30.000% v/v PEG-400 | 200.000 mM $ZnAc_2$ |
| 16 | 100.000 mM imidazole/HCl pH: 8. | 30.000% v/v PEG-400 | 200.000 mM $Li_2$ sulfate |
| 17 | 100.000 mM $Na_3$ citrate/citric acid pH: 5.5 | 30.000% v/v PEG-400 | 200.000 mM $MgCl_2$ |
| 18 | 100.000 mM $Na_3$ citrate/citric acid pH: 5.5 | 30.000% v/v PEG-400 | 200.000 mM $Li_2$ sulfate |

TABLE 3-continued

Crystallization Solution Set 3

| Solution | Compound Buffer | Precipitant | Salt |
|---|---|---|---|
| 19 | 100.000 mM imidazole/HCl pH: 8. | 30.000% v/v PEG-400 | 200.000 mM $ZnAc_2$ |
| 20 | 100.000 mM Tris base/HCl pH: 7. | 30.000% v/v PEG-400 | 200.000 mM NaCl |
| 21 | 100.000 mM $Na_2$ H phosphate/K $H_2$ phosphate pH: 6.2 | 15.000% v/v EtOH | 200.000 mM sodium chloride |
| 22 | 100.000 mM acetic acid/NaAc pH: 4.5 | 15.000% v/v EtOH | 200.000 mM $ZnAc_2$ |
| 23 | 100.000 mM cacodylic acid/Na cacodylate pH: 6.5 | 15.000% v/v EtOH | 200.000 mM $CaAc_2$ |
| 24 | 100.000 mM acetic acid/NaAc pH: 4.5 | 15.000% v/v EtOH | 200.000 mM $MgCl_2$ |

TABLE 4

Crystallization Solution Set 4

| Solution | Compound Buffer | Precipitant | Salt |
|---|---|---|---|
| 1 | 100.000 mM cacodylic acid/Na cacodylate pH: 6.5 | 15.000% v/v EtOH | 200.000 mM sodium chloride |
| 2 | 100.000 mM HEPES/HEPES pH: 7.5 | 10.000% w/v PEG-3000 | 200.000 mM sodium chloride |
| 3 | 100.000 mM MES/NaOH pH: 6. | 10.000% w/v PEG-3000 | 200.000 mM $ZnAc_2$ |
| 4 | 100.000 mM Tris base/HCl pH: 8.5 | 10.000% w/v PEG-3000 | 200.000 mM $CaAc_2$ |
| 5 | 100.000 mM $Na_3$ citrate/citric acid pH: 5.5 | 10.000% w/v PEG-3000 | 200.000 mM $MgCl_2$ |
| 6 | 100.000 mM Tris base/HCl pH: 8.5 | 10.000% w/v PEG-3000 | 200.000 mM $Li_2$ sulfate |
| 7 | 100.000 mM MES/NaOH pH: 6. | 10.000% w/v PEG-3000 | 200.000 mM $Li_2$ sulfate |
| 8 | 100.000 mM HEPES/HEPES pH: 7.5 | 1000.000 mM $(NH_4)_2$ H phosphate | 200.000 mM sodium chloride |
| 9 | 100.000 mM cacodylic acid/Na cacodylate pH: 6.5 | 1000.000 mM $(NH_4)_2$ H phosphate | 200.000 mM sodium chloride |
| 10 | 100.000 mM $Na_2$ H phosphate/K $H_2$ phosphate pH: 6.2 | 1260.000 mM $(NH_4)_2$ sulfate | 200.000 mM $Li_2$ sulfate |
| 11 | 100.000 mM Tris base/HCl pH: 7. | 1260.000 mM $(NH_4)_2$ sulfate | 200.000 mM $MgCl_2$ |
| 12 | 100.000 mM imidazole/HCl pH: 8. | 1260.000 mM $(NH_4)_2$ sulfate | 200.000 mM $Li_2$ sulfate |
| 13 | 100.000 mM $Na_3$ citrate/citric acid pH: 5.5 | 1260.000 mM $(NH_4)_2$ sulfate | 200.000 mM sodium chloride |
| 14 | 100.000 mM HEPES/HEPES pH: 7.5 | 20.000% w/v PEG-8000 | 200.000 mM sodium chloride |
| 15 | 100.000 mM Tris base/HCl pH: 7. | 20.000% w/v PEG-8000 | 200.000 mM $ZnAc_2$ |
| 16 | 100.000 mM imidazole/HCl pH: 8. | 20.000% w/v PEG-8000 | 200.000 mM $Li_2$ sulfate |
| 17 | 100.000 mM acetic acid/NaAc pH: 4.5 | 20.000% w/v PEG-8000 | 200.000 mM $MgCl_2$ |
| 18 | 100.000 mM cacodylic acid/Na cacodylate pH: 6.5 | 20.000% w/v PEG-8000 | 200.000 mM sodium chloride |
| 19 | 100.000 mM Tris base/HCl pH: 7. | 20.000% w/v PEG-8000 | 200.000 mM $MgCl_2$ |
| 20 | 100.000 mM HEPES/HEPES pH: 7.5 | 1000.000 mM $Na_3$ citrate | 200.000 mM sodium chloride |
| 21 | 100.000 mM MES/NaOH pH: 6. | 1000.000 mM $Na_3$ citrate | 200.000 mM $ZnAc_2$ |
| 22 | 100.000 mM imidazole/HCl pH: 8. | 1000.000 mM $Na_3$ citrate | 200.000 mM $Li_2$ sulfate |
| 23 | 100.000 mM acetic acid/NaAc pH: 4.5 | 1000.000 mM $Na_3$ citrate | 200.000 mM $MgCl_2$ |
| 24 | 100.000 mM Tris base/HCl pH: 8.5 | 1000.000 mM $Na_3$ citrate | 200.000 mM $Li_2$ sulfate |

TABLE 5

Crystallization Solution Set 5

| Solution | Compound Buffer | Precipitant | Salt |
|---|---|---|---|
| 1 | 100.000 mM MES/NaOH pH: 6. | 1000.000 mM Na$_3$ citrate | 200.000 mM MgCl$_2$ |
| 2 | 100.000 mM acetic acid/NaAc pH: 4.5 | 10.000% v/v isopropanol | 200.000 mM Li$_2$ sulfate |
| 3 | 100.000 mM Na$_3$ citrate/citric acid pH: 5.5 | 10.000% v/v isopropanol | 200.000 mM sodium chloride |
| 4 | 100.000 mM acetic acid/NaAc pH: 4.5 | 10.000% w/v PEG-8000 | 200.000 mM MgCl$_2$ |
| 5 | 100.000 mM Tris base/HCl pH: 8.5 | 10.000% w/v PEG-8000 | 200.000 mM sodium chloride |
| 6 | 100.000 mM acetic acid/NaAc pH: 4.5 | 20.000% w/v PEG-2000 MME | 200.000 mM ZnAc$_2$ |
| 7 | 100.000 mM Tris base/HCl pH: 8.5 | 20.000% w/v PEG-2000 MME | 200.000 mM Li$_2$ sulfate |
| 8 | 100.000 mM Tris base/HCl pH: 8.5 | 20.000% w/v 1,4-butanediol | 200.000 mM sodium chloride |
| 9 | 100.000 mM cacodylic acid/Na cacodylate pH: 6.5 | 20.000% w/v 1,4-butanediol | 200.000 mM Li$_2$ sulfate |
| 10 | 100.000 mM HEPES/NaOH pH: 7.5 | 20.000% w/v PEG-1000 | 200.000 mM Li$_2$ sulfate |
| 11 | 100.000 mM MES/NaOH pH: 6. | 20.000% w/v PEG-1000 | 200.000 mM MgCl$_2$ |
| 12 | 100.000 mM MES/NaOH pH: 6. | 2500.00 mM sodium chloride | 200.000 mM Li$_2$ sulfate |
| 13 | 100.000 mM Tris base/HCl pH: 8.5 | 30.000% w/v PEG-8000 | 200.000 mM Li$_2$ sulfate |
| 14 | 100.000 mM cacodylic acid/Na cacodylate pH: 6.5 | 30.000% w/v PEG-8000 | 200.000 mM CaAc$_2$ |
| 15 | 100.000 mM MES/NaOH pH: 6. | 30.000% w/v PEG-400 | 200.000 mM MgCl$_2$ |
| 16 | 100.000 mM Tris base/HCl pH: 7. | 30.000% w/v PEG-400 | 200.000 mM Li$_2$ sulfate |
| 17 | 100.000 mM HEPES/NaOH pH: 7.5 | 10.000% w/v PEG-3000 | 200.000 mM Li$_2$ sulfate |
| 18 | 100.000 mM MES/NaOH pH: 6. | 10.000% w/v PEG-3000 | 200.000 mM MgCl$_2$ |
| 19 | 100.000 mM imidazole/HCl pH: 8. | 1000.000 mM Na$_3$ citrate | 200.000 mM MgCl$_2$ |
| 20 | 100.000 mM Tris base/HCl pH: 8.5 | 1000.000 mM Na$_3$ citrate | 200.000 mM sodium chloride |
| 21 | 100.000 mM Tris base/HCl pH: 7. | 2500.000 mM NaMal | |
| 22 | 100.000 mM acetic acid/NaAc pH: 4.5 | 2500.000 mM NaMal | |
| 23 | 100.000 mM Tris base/HCl pH: 8.5 | 2500.000 mM NaMal | |
| 24 | 100.000 mM imidazole/HCl pH: 8. | 2500.000 mM NaMal | |

All of the crystallization solutions are made with ultrapure ASTM Type I water, and sterile-filtered into sterile tubes. The sterile crystallization solutions should be stored at room temperature. The following stock solutions are utilized to formulate the crystallization solutions.

Acetic Acid/NaAc RH 4.5. 1 M acetic acid and 1 M sodium acetate solutions are mixed together to make a pH 4.5 acetate stock solution. A 10-fold dilution of this stock solution is used in the final crystallization solution formulations, if required.

Na Cacodylate/HCl pH 6.5. A 1 M sodium cacodylate stock solution is adjusted to pH 6.5 with concentrated (37%) HCl. A 10-fold dilution of this stock solution is used in the final crystallization solution formulations, if required.

CAPS/NaOH pH 10.5. A 1 M CAPS stock solution is adjusted to pH 10.5 with 50% (w/v) NaOH. A 10-fold dilution of this solution is used in the final crystallization solution formulations, if required.

CHES/NaOH pH 9.5. A 1 M CHES stock solution is adjusted to pH 9.5 with 50% NaOH. A 10-fold dilution of this stock solution is used in the final crystallization solution formulations, if required.

Na$_3$ Citrate/Citric Acid pH 5.5. 0.5 M citric acid and 0.5 M sodium citrate solutions are mixed together to make a pH 5.5 citrate stock solution. A 5-fold dilution of this stock solution is used in the final crystallization solution formulations, if required.

HEPES/NaOH pH 7.5. A 1 M HEPES stock solution is adjusted to pH 7.5 with 50% NaOH. A 10-fold dilution of this stock solution is used in the final crystallization solution formulations, if required.

Imidazole/HCl pH 8.0. A 1 M imidazole stock solution is adjusted to pH 8.0 with concentrated HCl. A 10-fold dilution of this stock solution is used in the final crystallization solution formulations, if required.

MES/NaOH pH 6.0. A 1 M MES stock solution is adjusted to pH 6.0 with concentrated HCl. A 10-fold dilution of this stock solution is used in the final crystallization solution formulations, if required.

Na$_2$H Phosphate/KH$_2$ Phosphate pH 6.2. 0.5 M Na$_2$HPO$_4$ and 0.5 M KH$_2$PO$_4$ solutions are mixed together to make a pH 6.2 Na/K phosphate stock solution. A 5-fold dilution of this stock solution is used in the final crystallization solution formulations, if required.

Phosphate-citrate pH 4.2. 0.5 M $Na_2HPO_4$ and 0.5 M citric acid solutions are mixed together to make a pH 4.2 phosphate-citrate stock solution. A 5-fold dilution of this stock solution is used in the final crystallization solution formulations, if required.

Tris base/HCl pH 7.0 (or pH 8.5). A 1 M Tris base stock solution is adjusted to pH 7.0 or 8.5 with concentrated HCl. 10-fold dilutions of these stock solutions are used in the final crystallization solution formulations, if required.

When using the crystallization solutions of the present invention to crystallize a molecule, the molecule should be as highly purified as possible. If the molecule to be crystallized is a protein, preferably the protein should appear greater than 97% pure as determined by silver-stained SDS-PAGE. When the molecular sample is a biological macromolecule, such as a protein, the molecular sample should be in as minimal a buffer as possible (i.e., the buffer should contain as few chemical components as possible) to help maintain the biological activity of the macromolecule, and the molecular sample should preferably be at a concentration of 5–15 mg/ml.

The crystallization solution sets of the present invention can be used in any crystallization technique, such as vapor diffusion techniques as described, for example, in Gilliland, G. L. & Davies, D. R. (1984) *Methods in Enzymol.* 104:370–381; McPherson, A. (1990) *Eur. J. Biochem.* 189:1–23 and Weber, P. C. (1991) *Adv. in Prot. Chem.* 41:1–36. For example, hanging drop crystallization is a vapor diffusion technique that typically utilizes crystallization plates including a plurality of reservoirs, such as those available from Hampton Research (27632 El Lazo Rd., Laguna Niguel, Calif. 92677) and ICN-Flow (3300 Hyland Ave., Costa Mesa, Calif. 92626). In an exemplary hanging drop crystallization experiment, sealant, such as petroleum jelly or vacuum grease, is applied to the rim of a crystallization plate reservoir and 0.5–1.0 ml of a single crystallization solution of the present invention is pipetted into the reservoir. 1–10 µl (depending on availability) of the macromolecule sample is pipetted onto a siliconized cover slip (plates from Hampton Research and ICN-Flow typically require 22 mm square or round cover slips) and an equal volume of the crystallization solution that is in the reservoir is added to the sample drop on the cover slip and mixed by repeatedly aspirating and dispensing the solution from the pipettor. The cover slip is inverted and sealed over the reservoir. When a crystallization solution set of the present invention is utilized, this sequence of events can be repeated for all of the crystallization solutions in the crystallization solution set.

Similarly, sitting drop crystallization is a type of vapor diffusion technique that utilizes sitting drop crystallization plates, including a plurality of reservoirs within each of which is located a pedestal that includes a sample depression within its upper end, such as those available from Charles Supper Co. (15 Tech Circle, Natick, Mass. 01760). In an exemplary sitting drop crystallization experiment utilizing the crystallization solutions of the present invention, 0.5–1.0 ml of a single crystallization solution are pipetted into a reservoir of a sitting drop crystallization plate and 1–10 µl of the sample are pipetted into the sample depression of the sitting drop pedestal. An equal volume of the crystallization solution that is in the reservoir is added to the sample drop and mixed. This procedure can be repeated, utilizing a different crystallization solution in each of the reservoirs. The reservoirs can be individually sealed with sealant and cover slips, or the entire sitting drop plate can be sealed with a single piece of clear sealing tape after application of sample to all wells has been completed.

By way of non-limiting example, other crystallization techniques that can utilize the crystallization solution sets of the present invention include sandwich drop vapor diffusion which is similar to hanging drop and sitting drop vapor diffusion, except that the crystallization drop is contacted on two sides by glass or plastic surfaces. See, e.g., A. McPherson, *Eur. J. Biochem.* 189:1–23 (1990). Sandwich drop crystallization plates are available from Hampton Research and ICN-Flow. In the technique of crystallization using oils, the rate of equilibration by vapor diffusion can be modulated by placing a layer of oil between the crystallization drop and the reservoir (see, e.g., Chayen, N. E. (1997) *J. Appl. Cryst.* 30:198–202). Alternatively, oils can be used to seal microbatch crystallization drops, in the absence of a larger reservoir of crystallization solution (see, e.g, Chayen N. E. et al. (1990) *J. Appl. Cryst.* 23:297–302). In the technique of capillary crystallization, layers of sample solution and crystallization solution can be deposited in a capillary 0.5–1.0 mm in diameter, either with an air space between the solutions or with a direct liquid-liquid interface. Crystallization occurs by vapor diffusion or liquid-liquid diffusion inside the capillary.

If the supply of sample permits, it is preferable to set up the crystallizations in duplicate, with one set of crystallizations placed at room temperature (typically from about 16° C. to about 25° C.), and the other one at 4° C. Regardless of the crystallization method used, the crystallization trials should preferably be stored in a place free of vibrations or mechanical shock, which could result in premature precipitation.

Typically, observations of crystallization trials are recorded every one or two days. The crystallization trials can be viewed under a stereo microscope at 10–100× magnification. If less than ten percent of the samples in the crystallization screen do not show heavy precipitate after one day, it may be desirable to increase the concentration of the sample molecule. If more than fifty percent of the samples in the crystallization screen show heavy precipitate after one day, it may be desirable to reduce the sample molecule concentration.

Crystals suitable for X-ray data collection are generally 0.1 mm or greater in their smallest dimension, and have clean, sharp edges. Viewing the crystallization trials between crossed polarizers often aids in distinguishing microcrystals from amorphous precipitate. Except for the rather unusual occurrence of a cubic space group, X-ray diffraction quality biological macromolecule crystals are birefringent (have more than one refractive index), and turn polarized light. When rotated between crossed polarizers, the intensity and/or color of light transmitted through birefringent crystals will change, with a periodicity of 90°. Amorphous precipitates will not transmit and turn polarized light.

In another aspect, the present invention provides kits comprising at least one crystallization plate and a set of crystallization solutions comprising a set of crystallization solutions selected from the group of sets of crystallization solutions consisting of Crystallization Solution Set 1, Crystallization Solution Set 2, Crystallization Solution Set 3, Crystallization Solution Set 4, and Crystallization Solution Set 5. In some embodiments, the Crystallization Solution Sets are disposed with the reservoirs of the crystallization plate(s) which can therefore be immediately used to conduct crystallization experiments.

Any crystallization plate can be included in the kits of the present invention, including, by way of non-limiting example: Hampton Research plate models VDX, Linbro, Costar, Cryschem, Q-Plate, Q-Plate II and Crystal Clear Strips; Charles Supper Co. sitting drop plates and ICN Linbro model. The presently preferred crystallization plates are disclosed in U.S. Pat. No. 6,039,804, incorporated herein by reference.

Figure 2:
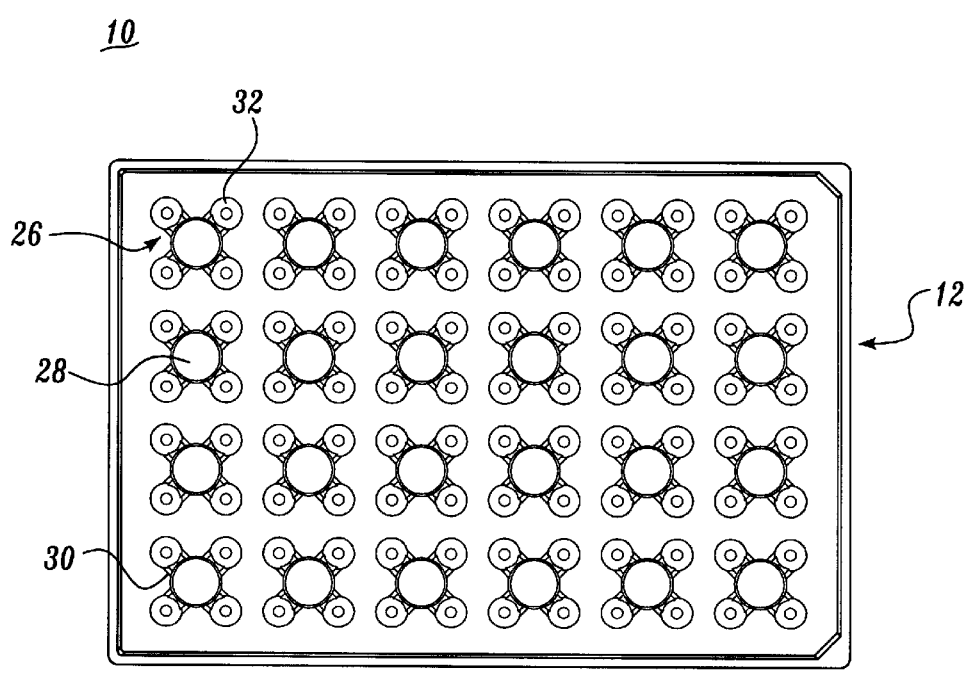
FIG. 2 is a view of the upper surface of a presently preferred crystallization plate useful for inclusion in a kit of the present invention.

By way of representative example, a presently preferred crystallization plate for inclusion in a kit of the present invention is shown in FIGS. 1 and 2. With reference to FIGS. 1 and 2, crystallization plate 10 includes a body 12 having an upper surface 14, a lower surface 16, a first end 18, a second end 20, a first side 22 and a second side 24. Body 12 defines a plurality of crystallization units 26. Each crystallization unit 26 includes a central reservoir 28, four diffusion channels 30 and four drop chambers 32. Each drop chamber 32 is connected to central reservoir 28 by one diffusion channel 30. While the plate of FIGS. 1 and 2 is preferred, other plates or arrays of vessels may suitably be employed with the solutions of the present invention.

A kit of the present invention may optionally include, for example, water-permeable silicone oil DC200 (BDH, Gallard Schlesinger Industries, 584 Mineola Ave., Carle Place, N.Y. 11514-1744, Catalogue number #63002 4N), and/or paraffin oil (Fluka Chemical Corp., 980 South 2nd St., Ronkonkoma, N.Y. 11779-7238, catalogue number #76235) which are useful in microbatch crystallizations, and vapor diffusion crystallizations with oils.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A set of crystallization solutions comprising a crystallization solution set selected from the group of crystallization solution sets consisting of:

| Solution | Compound Buffer | Precipitant | Salt |
|---|---|---|---|
| (a) Crystallization Solution Set 1: | | | |
| 1 | 100.000 mM HEPES/NaOH pH: 7.5 | 10.000% v/v isopropanol | 200.000 mM sodium chloride |
| 2 | 100.000 mM Na$_3$ citrate/citric acid pH: 5.5 | 20.000% w/v PEG-3000 | |
| 3 | 100.000 mM MES/NaOH pH: 6. | 10.000% w/v PEG-8000 | 200.000 mM ZnAc$_2$ |
| 4 | 100.000 mM Na$_3$ citrate/citric acid pH: 5.5 | 2000.000 mM (NH$_4$)$_2$ sulfate | |
| 5 | 100.000 mM Tris base/HCl pH: 7. | 20.000% w/v PEG-2000 MME | |
| 6 | 100.000 mM MES/NaOH pH: 6. | 20.000% v/v 1,4-butane-diol | 200.000 mM Li$_2$ sulfate |
| 7 | 100.000 mM imidazole/HCl pH: 8. | 20.000% w/v PEG-1000 | 200.000 mM CaAc$_2$ |
| 8 | 100.000 mM Na$_2$ H phosphate/K H$_2$ phosphate pH: 6.2 | 2500.000 mM sodium chloride | |
| 9 | 100.000 mM acetic acid/NaAc pH: 4.5 | 30.000% w/v PEG-8000 | 200.000 mM Li$_2$ sulfate |
| 10 | 100.000 mM Tris base/HCl pH: 8.5 | 10.000% v/v isopropanol | |
| 11 | 100.000 mM Tris base/HCl pH: 8.5 | 30.000% w/v PEG-400 | 200.000 mM MgCl$_2$ |
| 12 | 100.000 mM imidazole/HCl pH: 8. | 2500.000 mM sodium chloride | |
| 13 | 100.000 mM MES/NaOH pH: 6. | 10.000% v/v isopropanol | 200.000 mM CaAc$_2$ |
| 14 | 100.000 mM Tris base/HCl pH: 7. | 15.000% v/v EtOH | |
| 15 | 100.000 mM acetic acid/NaAc pH: 4.5 | 30.000% w/v PEG-400 | 200.000 mM CaAc$_2$ |
| 16 | 100.000 mM acetic acid/NaAc pH: 4.5 | 20.000% w/v PEG-1000 | 200.000 mM ZnAc$_2$ |
| 17 | 100.000 mM acetic acid/NaAc pH: 4.5 | 10.000% w/v PEG-3000 | 200.000 mM ZnAc$_2$ |
| 18 | 100.000 mM Na$_2$ H phosphate/K H$_2$ phosphate pH: 6.2 | 10.000% w/v PEG-8000 | 200.000 mM sodium chloride |
| 19 | 100.000 mM Tris base/HCl pH: 8.5 | 1000.000 mM (NH$_4$)$_2$ H phosphate | |
| 20 | 100.000 mM Na cacodylate/HCl pH: 6.5 | 10.000% v/v isopropanol | 200.000 mM ZnAc$_2$ |
| 21 | 100.000 mM Na cacodylate/HCl pH: 6.5 | 30.000% v/v PEG-400 | 200.000 mM Li$_2$ sulfate |
| 22 | 100.000 mM Na$_3$ citrate/citric acid pH: 5.5 | 15.000% v/v EtOH | 200.000 mM Li$_2$ sulfate |
| 23 | 100.000 mM HEPES/NaOH pH: 7.5 | 1260.000 mM (NH$_4$)$_2$ sulfate | |
| 24 | 100.000 mM Tris base/HCl pH: 7. | 2500.000 mM sodium chloride | 200.000 mM MgCl$_2$ |
| 25 | 100.000 mM MES/NaOH pH: 6. | 15.000% v/v EtOH | 200.000 mM ZnAc$_2$ |
| 26 | 100.000 mM imidazole/HCl pH: 8. | 10.000% v/v isopropanol | |
| 27 | 100.000 mM HEPES/NaOH pH: 7.5 | 15.000% v/v EtOH | 200.000 mM MgCl$_2$ |
| 28 | 100.000 mM Na cacodylate/HCl pH: 6.5 | 10.000% w/v PEG-3000 | 200.000 mM MgCl$_2$ |
| 29 | 100.000 mM MES/NaOH pH: 6. | 20.000% w/v PEG-8000 | 200.000 mM CaAc$_2$ |
| 30 | 100.000 mM CHES/NaOH pH: 9.5 | 1260.000 mM (NH$_4$)$_2$ sulfate | 200.000 mM sodium chloride |
| 31 | 100.000 mM imidazole/HCl pH: 8. | 20.000% v/v 1,4-butane-diol | 200.000 mM ZnAc$_2$ |
| 32 | 100.000 mM Tris base/HCl pH: 7. | 1000.000 mM Na$_3$ citrate | 200.000 mM sodium chloride |
| 33 | 100.000 mM HEPES/NaOH pH: 7.5 | 30.000% v/v PEG-400 | 200.000 mM sodium chloride |
| 34 | 100.000 mM Tris base/HCl pH: 7. | 10.000% w/v PEG-8000 | 200.000 mM MgCl$_2$ |
| 35 | 100.000 mM Na cacodylate/HCl pH: 6.5 | 20.000% w/v PEG-1000 | 200.000 mM MgCl$_2$ |
| 36 | 100.000 mM imidazole/HCl pH: 8. | 2500.000 mM sodium chloride | 200.000 mM ZnAc$_2$ |
| 37 | 100.000 mM Na$_2$ H phosphate/K H$_2$ phosphate pH: 6.2 | 40.000% v/v EG | |
| 38 | 100.000 mM Tris base/HCl pH: 8.5 | 30.000% v/v PEG-200 | 200.000 mM (NH$_4$)$_2$ H phosphate |
| 39 | 100.000 mM HEPES/NaOH pH: 7.5 | 10.000% v/v glycerol 30.000% v/v PEG-600 | 50.000 mM Li$_2$ sulfate |
| 40 | 100.000 mM HEPES/NaOH pH: 7.5 | 40.000% v/v EG 5.000% w/v PEG-3000 | |
| 41 | 100.000 mM Tris base/HCl pH: 7. | 40.000% v/v EG | |
| 42 | 100.000 mM Tris base/HCl pH: 8.5 | 50.000% v/v EG | 200.000 mM MgCl$_2$ |
| 43 | 100.000 mM Tris base/HCl pH: 8.5 | 5.000% w/v PEG-8000 10.000% v/v glycerol 20.000% v/v PEG-300 | |
| 44 | 100.000 mM acetic acid/NaAc pH: 4.5 | 40.000% v/v PEG-400 | |

-continued

| Solution | Compound Buffer | Precipitant | Salt |
|---|---|---|---|
| 45 | 100.000 mM Tris base/HCl pH: 7. | 10.000% v/v glycerol 30.000% v/v PEG-600 | 500.000 mM $(NH_4)_2$ sulfate |
| 46 | 100.000 mM HEPES/NaOH pH: 7.5 | 50.000% v/v EG | 200.000 mM $Li_2$ sulfate |
| 47 | 100.000 mM acetic acid/NaAc pH: 4.5 | 30.000% v/v PEG-200 | 100.000 mM sodium chloride |
| 48 | 100.000 mM CAPS/NaOH pH: 10.5 | 30.000% v/v PEG-200 | 200.000 mM $(NH_4)_2$ sulfate |

(b) Crystallization Solution Set 2:

| Solution | Compound Buffer | Precipitant | Salt |
|---|---|---|---|
| 1 | 100.000 mM Tris base/HCl pH: 7. | 10.000% v/v isopropanol | 200.000 mM $ZnAc_2$ |
| 2 | 100.000 mM acetic acid/NaAc pH: 4.5 | 10.000% v/v isopropanol | 200.000 mM $CaAc_2$ |
| 3 | 100.000 mM $Na_3$ citrate/$Na_3$ citrate pH: 5.5 | 10.000% v/v isopropanol | 200.000 mM $Li_2$ sulfate |
| 4 | 100.000 mM Tris base/HCl pH: 7. | 10.000% v/v isopropanol | 200.000 mM $CaAc_2$ |
| 5 | 100.000 mM acetic acid/NaAc pH: 4.5 | 10.000% v/v isopropanol | 200.000 mM sodium chloride |
| 6 | 100.000 mM $Na_3$ citrate/$Na_3$ citrate pH: 5.5 | 10.000% v/v isopropanol | 200.000 mM $MgCl_2$ |
| 7 | 100.000 mM HEPES/NaOH pH: 7.5 | 10.000% w/v PEG-8000 | 200.000 mM sodium chloride |
| 8 | 100.000 mM MES/NaOH pH: 6. | 10.000% w/v PEG-8000 | 200.000 mM $ZnAc_2$ |
| 9 | 100.000 mM $Na_2$ H phosphate/K $H_2$ phosphate pH: 6.2 | 10.000% w/v PEG-8000 | 200.000 mM $Li_2$ sulfate |
| 10 | 100.000 mM acetic acid/NaAc pH: 4.5 | 10.000% w/v PEG-8000 | 200.000 mM $CaAc_2$ |
| 11 | 100.000 mM Tris base/HCl pH: 8.5 | 10.000% w/v PEG-8000 | 200.000 mM $MgCl_2$ |
| 12 | 100.000 mM Na cacodylate/HCl pH: 6.5 | 10.000% w/v PEG-8000 | 200.000 mM sodium chloride |
| 13 | 100.000 mM $Na_3$ citrate/citric acid pH: 5.5 | 10.000% w/v PEG-8000 | 200.000 mM $Li_2$ sulfate |
| 14 | 100.000 mM HEPES/NaOH pH: 7.5 | 10.000% w/v PEG-8000 | 200.000 mM $MgCl_2$ |
| 15 | 100.000 mM HEPES/NaOH pH: 7.5 | 20.000% w/v PEG-2000 MME | 200.000 mM NaCl |
| 16 | 100.000 mM MES/NaOH pH: 6. | 20.000% w/v PEG-2000 MME | 200.000 mM $ZnAc_2$ |
| 17 | 100.000 mM $Na_2$ H phosphate/K $H_2$ phosphate pH: 6.2 | 20.000% w/v PEG-2000 MME 200.000 mM $Li_2$ sulfate | |
| 18 | 100.000 mM acetic acid/NaAc pH: 4.5 | 20.000% w/v PEG-2000 MME | 200.000 mM $CaAc_2$ |
| 19 | 100.000 mM Tris base/HCl pH: 8.5 | 20.000% w/v PEG-2000 MME | 200.000 mM $MgCl_2$ |
| 20 | 100.000 mM cacodylic acid/Na cacodylate pH: 6.5 | 20.000% w/v PEG-2000 MME 200.000 mM $Li_2$ sulfate | |
| 21 | 100.000 mM HEPES/NaOH pH: 7.5 | 20.000% w/v PEG-2000 MME 200.000 mM $Li_2$ sulfate | |
| 22 | 100.000 mM Tris base/HCl pH: 8.5 | 20.000% v/v 1,4-butanediol 200.000 mM $Li_2$ sulfate | |
| 23 | 100.000 mM cacodylic acid/Na cacodylate pH: 6.5 | 20.000% v/v 1,4-butanediol | 200.000 mM $CaAc_2$ |
| 24 | 100.000 mM $Na_3$ citrate/citric acid pH: 5.5 | 20.000% v/v 1,4-butanediol | 200.000 mM $MgCl_2$ |

(c) Crystallization Solution Set 3:

| Solution | Compound Buffer | Precipitant | Salt |
|---|---|---|---|
| 1 | 100.000 mM Tris base/HCl pH: 7. | 20.000% v/v 1,4-butanediol | 200.000 mM $ZnAc_2$ |
| 2 | 100.000 mM Tris base/HCl pH: 8.5 | 20.000% v/v 1,4-butanediol | 200.000 mM $MgCl_2$ |
| 3 | 100.000 mM $Na_3$ citrate/citric acid pH: 5.5 | 20.000% v/v 1,4-butanediol | 200.000 mM sodium chloride |
| 4 | 100.000 mM HEPES/NaOH pH: 7.5 | 20.000% w/v PEG-1000 | 200.000 mM sodium chloride |
| 5 | 100.000 mM MES/NaOH pH: 6 | 20.000% w/v PEG-1000 | 200.000 mM $ZnAc_2$ |
| 6 | 100.000 mM Tris base/HCl pH: 7. | 20.000% w/v PEG-1000 | 200.000 mM $Li_2$ sulfate |
| 7 | 100.000 mM HEPES/NaOH pH: 7.5 | 20.000% w/v PEG-1000 | 200.000 mM $MgCl_2$ |
| 8 | 100.000 mM MES/NaOH pH: 6. | 20.000% w/v PEG-1000 | 200.000 mM sodium chloride |
| 9 | 100.000 mM HEPES/NaOH pH: 7.5 | 2500.000 mM sodium chloride | |
| 10 | 100.000 mM MES/NaOH pH: 6. | 2500.000 mM sodium chloride | 200.000 mM $ZnAc_2$ |
| 11 | 100.000 mM Tris base/HCl pH: 8.5 | 2500.000 mM sodium chloride | 200.000 mM $Li_2$ sulfate |
| 12 | 100.000 mM cacodylic acid/Na cacodylate pH: 6.5 | 2500.000 mM sodium chloride | 200.000 mM $CaAc_2$ |
| 13 | 100.000 mM $Na_3$ citrate/citric acid pH: 5.5 | 2500.000 mM sodium chloride | 200.000 mM $MgCl_2$ |
| 14 | 100.000 mM cacodylic acid/Na cacodylate pH: 6.5 | 2500.000 mM sodium chloride | 200.000 mM $Li_2$ sulfate |
| 15 | 100.000 mM Tris base/HCl pH: 7. | 30.000% v/v PEG-400 | 200.000 mM $ZnAc_2$ |
| 16 | 100.000 mM imidazole/HCl pH: 8. | 30.000% v/v PEG-400 | 200.000 mM $Li_2$ sulfate |
| 17 | 100.000 mM $Na_3$ citrate/citric acid pH: 5.5 | 30.000% v/v PEG-400 | 200.000 mM $MgCl_2$ |
| 18 | 100.000 mM $Na_3$ citrate/citric acid pH: 5.5 | 30.000% v/v PEG-400 | 200.000 mM $Li_2$ sulfate |
| 19 | 100.000 mM imidazole/HCl pH: 8. | 30.000% v/v PEG-400 | 200.000 mM $ZnAc_2$ |
| 20 | 100.000 mM Tris base/HCl pH: 7. | 30.000% v/v PEG-400 | 200.000 mM NaCl |
| 21 | 100.000 mM $Na_2$ H phosphate/K $H_2$ phosphate pH: 6.2 | 15.000% v/v EtOH | 200.000 mM sodium chloride |
| 22 | 100.000 mM acetic acid/NaAc pH: 4.5 | 15.000% v/v EtOH | 200.000 mM $ZnAc_2$ |
| 23 | 100.000 mM cacodylic acid/Na cacodylate pH: 6.5 | 15.000% v/v EtOH | 200.000 mM $CaAc_2$ |
| 24 | 100.000 mM acetic acid/NaAc pH: 4.5 | 15.000% v/v EtOH | 200.000 mM $MgCl_2$ |

(d) Crystallization Solution Set 4:

| Solution | Compound Buffer | Precipitant | Salt |
|---|---|---|---|
| 1 | 100.000 mM cacodylic acid/Na cacodylate pH: 6.5 | 15.000% v/v EtOH | 200.000 mM sodium chloride |
| 2 | 100.000 mM HEPES/HEPES pH: 7.5 | 10.000% w/v PEG-3000 | 200.000 mM sodium chloride |

-continued

| Solution | Compound Buffer | Precipitant | Salt |
|---|---|---|---|
| 3 | 100.000 mM MES/NaOH pH: 6. | 10.000% w/v PEG-3000 | 200.000 mM ZnAc$_2$ |
| 4 | 100.000 mM Tris base/HCl pH: 8.5 | 10.000% w/v PEG-3000 | 200.000 mM CaAc$_2$ |
| 5 | 100.000 mM Na$_3$ citrate/citric acid pH: 5.5 | 10.000% w/v PEG-3000 | 200.000 mM MgCl$_2$ |
| 6 | 100.000 mM Tris base/HCl pH: 8.5 | 10.000% w/v PEG-3000 | 200.000 mM Li$_2$ sulfate |
| 7 | 100.000 mM MES/NaOH pH: 6. | 10.000% w/v PEG-3000 | 200.000 mM Li$_2$ sulfate |
| 8 | 100.000 mM HEPES/HEPES pH: 7.5 | 1000.000 mM (NH$_4$)$_2$ H phosphate | 200.000 mM sodium chloride |
| 9 | 100.000 mM cacodylic acid/Na cacodylate pH: 6.5 | 1000.000 mM (NH$_4$)$_2$ H phosphate | 200.000 mM sodium chloride |
| 10 | 100.000 mM Na$_2$ H phosphate/K H$_2$ phosphate pH: 6.2 | 1260.000 mM (NH$_4$)$_2$ sulfate | 200.000 mM Li$_2$ sulfate |
| 11 | 100.000 mM Tris base/HCl pH: 7. | 1260.000 mM (NH$_4$)$_2$ sulfate | 200.000 mM MgCl$_2$ |
| 12 | 100.000 mM imidazole/HCl pH: 8. | 1260.000 mM (NH$_4$)$_2$ sulfate | 200.000 mM Li$_2$ sulfate |
| 13 | 100.000 mM Na$_3$ citrate/citric acid pH: 5.5 | 1260.000 mM (NH$_4$)$_2$ sulfate | 200.000 mM sodium chloride |
| 14 | 100.000 mM HEPES/HEPES pH: 7.5 | 20.000% w/v PEG-8000 | 200.000 mM sodium chloride |
| 15 | 100.000 mM Tris base/HCl pH: 7. | 20.000% w/v PEG-8000 | 200.000 mM ZnAc$_2$ |
| 16 | 100.000 mM imidazole/HCl pH: 8. | 20.000% w/v PEG-8000 | 200.000 mM Li$_2$ sulfate |
| 17 | 100.000 mM acetic acid/NaAc pH: 4.5 | 20.000% w/v PEG-8000 | 200.000 mM MgCl$_2$ |
| 18 | 100.000 mM cacodylic acid/Na cacodylate pH: 6.5 | 20.000% w/v PEG-8000 | 200.000 mM sodium chloride |
| 19 | 100.000 mM Tris base/HCl pH: 7. | 20.000% w/v PEG-8000 | 200.000 mM MgCl$_2$ |
| 20 | 100.000 mM HEPES/HEPES pH: 7.5 | 1000.000 mM Na$_3$ citrate | 200.000 mM sodium chloride |
| 21 | 100.000 mM MES/NaOH pH: 6. | 1000.000 mM Na$_3$ citrate | 200.000 mM ZnAc$_2$ |
| 22 | 100.000 mM imidazole/HCl pH: 8. | 1000.000 mM Na$_3$ citrate | 200.000 mM Li$_2$ sulfate |
| 23 | 100.000 mM acetic acid/NaAc pH: 4.5 | 1000.000 mM Na$_3$ citrate | 200.000 mM MgCl$_2$ |
| 24 | 100.000 mM Tris base/HCl pH: 8.5 | 1000.000 mM Na$_3$ citrate | 200.000 mM Li$_2$ sulfate |
| (e) Crystallization Solution Set 5: | | | |
| 1 | 100.000 mM MES/NaOH pH: 6. | 1000.000 mM Na$_3$ citrate | 200.000 mM MgCl$_2$ |
| 2 | 100.000 mM acetic acid/NaAc pH: 4.5 | 10.000% v/v isopropanol | 200.000 mM Li$_2$ sulfate |
| 3 | 100.000 mM Na$_3$ citrate/citric acid pH: 5.5 | 10.000% v/v isopropanol | 200.000 mM sodium chloride |
| 4 | 100.000 mM acetic acid/NaAc pH: 4.5 | 10.000% w/v PEG-8000 | 200.000 mM MgCl$_2$ |
| 5 | 100.000 mM Tris base/HCl pH: 8.5 | 10.000% w/v PEG-8000 | 200.000 mM sodium chloride |
| 6 | 100.000 mM acetic acid/NaAc pH: 4.5 | 20.000% w/v PEG-2000 MME | 200.000 mM ZnAc$_2$ |
| 7 | 100.000 mM Tris base/HCl pH: 8.5 | 20.000% w/v PEG-2000 MME | 200.000 mM Li$_2$ sulfate |
| 8 | 100.000 mM Tris base/HCl pH: 8.5 | 20.000% w/v 1,4-butane-diol | 200.000 mM sodium chloride |
| 9 | 100.000 mM cacodylic acid/Na cacodylate pH: 6.5 | 20.000% w/v 1,4-butane-diol | 200.000 mM Li$_2$ sulfate |
| 10 | 100.000 mM HEPES/NaOH pH: 7.5 | 20.000% w/v PEG-1000 | 200.000 mM Li$_2$ sulfate |
| 11 | 100.000 mM MES/NaOH pH: 6. | 20.000% w/v PEG-1000 | 200.000 mM MgCl$_2$ |
| 12 | 100.000 mM MES/NaOH pH: 6. | 2500.000 nM sodium chloride | 200.000 mM Li$_2$ sulfate |
| 13 | 100.000 mM Tris base/HCl pH: 8.5 | 30.000% w/v PEG-8000 | 200.000 mM Li$_2$ sulfate |
| 14 | 100.000 mM cacodylic acid/Na cacodylate pH: 6.5 | 30.000% w/v PEG-8000 | 200.000 mM CaAc$_2$ |
| 15 | 100.000 mM MES/NaOH pH: 6. | 30.000% w/v PEG-400 | 200.000 mM MgCl$_2$ |
| 16 | 100.000 mM Tris base/HCl pH: 7. | 30.000% w/v PEG-400 | 200.000 mM Li$_2$ sulfate |
| 17 | 100.000 mM HEPES/NaOH pH: 7.5 | 10.000% w/v PEG-3000 | 200.000 mM Li$_2$ sulfate |
| 18 | 100.000 mM MES/NaOH pH: 6. | 10.000% w/v PEG-3000 | 200.000 mM MgCl$_2$ |
| 19 | 100.000 mM imidazole/HCl pH: 8. | 1000.000 mM Na$_3$ citrate | 200.000 mM MgCl$_2$ |
| 20 | 100.000 mM Tris base/HCl pH: 8.5 | 1000.000 mM Na$_3$ citrate | 200.000 mM sodium chloride |
| 21 | 100.000 mM Tris base/HCl pH: 7. | 2500.000 mM NaMal | |
| 22 | 100.000 mM acetic acid/NaAc pH: 4.5 | 2500.000 mM NaMal | |
| 23 | 100.000 mM Tris base/HCl pH: 8.5 | 2500.000 mM NaMal | |
| 24 | 100.000 mM imidazole/HCl pH: 8. | 2500.000 mM NaMal. | |

2. The set of crystallization solutions of claim 1 comprising Crystallization Solution Set 1.

3. The set of crystallization solutions of claim 2 consisting of Crystallization Solution Set 1.

4. The set of crystallization solutions of claim 1 comprising Crystallization Solution Set 2.

5. The set of crystallization solutions of claim 4 consisting of Crystallization Solution Set 2.

6. The set of crystallization solutions of claim 1 comprising Crystallization Solution Set 3.

7. The set of crystallization solutions of claim 6 consisting of Crystallization Solution Set 3.

8. The set of crystallization solutions of claim 1 comprising Crystallization Solution Set 4.

9. The set of crystallization solutions of claim 8 consisting of Crystallization Solution Set 4.

10. The set of crystallization solutions of claim 1 comprising Crystallization Solution Set 5.

11. The set of crystallization solutions of claim 10 consisting of Crystallization Solution Set 5.

12. A kit comprising at least one crystallization plate and a set of crystallization solutions comprising a set of crys tallization solutions selected from the group of crystallization solution sets consisting of:

| Solution | Compound Buffer | Precipitant | Salt |
|---|---|---|---|
| (a) Crystallization Solution Set 1: | | | |
| 1 | 100.000 mM HEPES/NaOH pH: 7.5 | 10.000% v/v isopropanol | 200.000 mM sodium chloride |
| 2 | 100.000 mM $Na_3$ citrate/citric acid pH: 5.5 | 20.000% w/v PEG-3000 | |
| 3 | 100.000 mM MES/NaOH pH: 6. | 10.000% w/v PEG-8000 | 200.000 mM $ZnAc_2$ |
| 4 | 100.000 mM $Na_3$ citrate/citric acid pH: 5.5 | 2000.000 mM $(NH_4)_2$ sulfate | |
| 5 | 100.000 mM Tris base/HCl pH: 7. | 20.000% w/v PEG-2000 MME | |
| 6 | 100.000 mM MES/NaOH pH: 6. | 20.000% v/v 1,4-butane-diol | 200.000 mM $Li_2$ sulfate |
| 7 | 100.000 mM imidazole/HCl pH: 8. | 20.000% w/v PEG-1000 | 200.000 mM $CaAc_2$ |
| 8 | 100.000 mM $Na_2$ H phosphate/K $H_2$ phosphate pH: 6.2 | 2500.000 mM sodium chloride | |
| 9 | 100.000 mM acetic acid/NaAc pH: 4.5 | 30.000% w/v PEG-8000 | 200.000 mM $Li_2$ sulfate |
| 10 | 100.000 mM Tris base/HCl pH: 8.5 | 10.000% v/v isopropanol | |
| 11 | 100.000 mM Tris base/HCl pH: 8.5 | 30.000% v/v PEG-400 | 200.000 mM $MgCl_2$ |
| 12 | 100.000 mM imidazole/HCl pH: 8. | 2500.000 mM sodium chloride | |
| 13 | 100.000 mM MES/NaOH pH: 6. | 10.000% v/v isopropanol | 200.000 mM $CaAc_2$ |
| 14 | 100.000 mM Tris base/HCl pH: 7. | 15.000% v/v EtOH | |
| 15 | 100.000 mM acetic acid/NaAc pH: 4.5 | 30.000% w/v PEG-400 | 200.000 mM $CaAc_2$ |
| 16 | 100.000 mM acetic acid/NaAc pH: 4.5 | 20.000% w/v PEG-1000 | 200.000 mM $ZnAc_2$ |
| 17 | 100.000 mM acetic acid/NaAc pH: 4.5 | 10.000% w/v PEG-3000 | 200.000 mM $ZnAc_2$ |
| 18 | 100.000 mM $Na_2$ H phosphate/K $H_2$ phosphate pH: 6.2 | 10.000% w/v PEG-8000 | 200.000 mM sodium chloride |
| 19 | 100.000 mM Tris base/HCl pH: 8.5 | 1000.000 mM $(NH_4)_2$ H phosphate | |
| 20 | 100.000 mM Na cacodylate/HCl pH: 6.5 | 10.000% v/v isopropanol | 200.000 mM $ZnAc_2$ |
| 21 | 100.000 mM Na cacodylate/HCl pH: 6.5 | 30.000% v/v PEG-400 | 200.000 mM $Li_2$ sulfate |
| 22 | 100.000 mM $Na_3$ citrate/citric acid pH: 5.5 | 15.000% v/v EtOH | 200.000 mM $Li_2$ sulfate |
| 23 | 100.000 mM HEPES/NaOH pH: 7.5 | 1260.000 mM $(NH_4)_2$ sulfate | |
| 24 | 100.000 mM Tris base/HCl pH: 7. | 2500.000 mM sodium chloride | 200.000 mM $MgCl_2$ |
| 25 | 100.000 mM MES/NaOH pH: 6. | 15.000% v/v EtOH | 200.000 mM $ZnAc_2$ |
| 26 | 100.000 mM imidazole/HCl pH: 8. | 10.000% v/v isopropanol | |
| 27 | 100.000 mM HEPES/NaOH pH: 7.5 | 15.000% v/v EtOH | 200.000 mM $MgCl_2$ |
| 28 | 100.000 mM Na cacodylate/HCl pH: 6.5 | 10.000% w/v PEG-3000 | 200.000 mM $MgCl_2$ |
| 29 | 100.000 mM MES/NaOH pH: 6. | 20.000% w/v PEG-8000 | 200.000 mM $CaAc_2$ |
| 30 | 100.000 mM CHES/NaOH pH: 9.5 | 1260.000 mM $(NH_4)_2$ sulfate | 200.000 mM sodium chloride |
| 31 | 100.000 mM imidazole/HCl pH: 8. | 20.000% v/v 1,4-butane-diol | 200.000 mM $ZnAc_2$ |
| 32 | 100.000 mM Tris base/HCl pH: 7. | 1000.000 mM $Na_3$ citrate | 200.000 mM sodium chloride |
| 33 | 100.000 mM HEPES/NaOH pH: 7.5 | 30.000% v/v PEG-400 | 200.000 mM sodium chloride |
| 34 | 100.000 mM Tris base/HCl pH: 7. | 10.000% w/v PEG-8000 | 200.000 mM $MgCl_2$ |
| 35 | 100.000 mM Na cacodylate/HCl pH: 6.5 | 20.000% w/v PEG-1000 | 200.000 mM $MgCl_2$ |
| 36 | 100.000 mM imidazole/HCl pH: 8. | 2500.000 mM sodium chloride | 200.000 mM $ZnAc_2$ |
| 37 | 100.000 mM $Na_2$ H phosphate/K $H_2$ phosphate pH: 6.2 | 40.000% v/v EG | |
| 38 | 100.000 mM Tris base/HCl pH: 8.5 | 30.000% v/v PEG-200 | 200.000 mM $(NH_4)_2$ H phosphate |
| 39 | 100.000 mM HEPES/NaOH pH: 7.5 | 10.000% v/v glycerol 30.000% v/v PEG-600 | 50.000 mM $Li_2$ sulfate |
| 40 | 100.000 mM HEPES/NaOH pH: 7.5 | 40.000% v/v EG 5.000% w/v PEG-3000 | |
| 41 | 100.000 mM Tris base/HCl pH: 7. | 40.000% v/v EG | |
| 42 | 100.000 mM Tris base/HCl pH: 8.5 | 50.000% v/v EG | 200.000 mM $MgCl_2$ |
| 43 | 100.000 mM Tris base/HCl pH: 8.5 | 5.000% w/v PEG-8000 10.000% v/v glycerol 20.000% v/v PEG-300 | |
| 44 | 100.000 mM acetic acid/NaAc pH: 4.5 | 40.000% v/v PEG-400 | |
| 45 | 100.000 mM Tris base/HCl pH: 7. | 10.000% v/v glycerol 30.000% v/v PEG-600 | 500.000 mM $(NH_4)_2$ sulfate |
| 46 | 100.000 mM HEPES/NaOH pH: 7.5 | 50.000% v/v EG | 200.000 mM $Li_2$ sulfate |
| 47 | 100.000 mM acetic acid/NaAc pH: 4.5 | 30.000% v/v PEG-200 | 100.000 mM sodium chloride |
| 48 | 100.000 mM CAPS/NaOH pH: 10.5 | 30.000% v/v PEG-200 | 200.000 mM $(NH_4)_2$ sulfate |
| (b) Crystallization Solution Set 2: | | | |
| 1 | 100.000 mM Tris base/HCl pH: 7. | 10.000% v/v isopropanol | 200.000 mM $ZnAc_2$ |
| 2 | 100.000 mM acetic acid/NaAc pH: 4.5 | 10.000% v/v isopropanol | 200.000 mM $CaAc_2$ |
| 3 | 100.000 mM $Na_3$ citrate/$Na_3$ citrate pH: 5.5 | 10.000% v/v isopropanol | 200.000 mM $Li_2$ sulfate |
| 4 | 100.000 mM Tris base/HCl pH: 7. | 10.000% v/v isopropanol | 200.000 mM $CaAc_2$ |
| 5 | 100.000 mM acetic acid/NaAc pH: 4.5 | 10.000% v/v isopropanol | 200.000 mM sodium chloride |
| 6 | 100.000 mM $Na_3$ citrate/$Na_3$ citrate pH: 5.5 | 10.000% v/v isopropanol | 200.000 mM $MgCl_2$ |
| 7 | 100.000 mM HEPES/NaOH pH: 7.5 | 10.000% w/v PEG-8000 | 200.000 mM sodium chloride |
| 8 | 100.000 mM MES/NaOH pH: 6. | 10.000% w/v PEG-8000 | 200.000 mM $ZnAc_2$ |
| 9 | 100.000 mM $Na_2$ H phosphate/K $H_2$ phosphate pH: 6.2 | 10.000% w/v PEG-8000 | 200.000 mM $Li_2$ sulfate |
| 10 | 100.000 mM acetic acid/NaAc pH: 4.5 | 10.000% w/v PEG-8000 | 200.000 mM $CaAc_2$ |

-continued

| Solution | Compound Buffer | Precipitant | Salt |
|---|---|---|---|
| 11 | 100.000 mM Tris base/HCl pH: 8.5 | 10.000% w/v PEG-8000 | 200.000 mM $MgCl_2$ |
| 12 | 100.000 mM Na cacodylate/HCl pH: 6.5 | 10.000% w/v PEG-8000 | 200.000 mM sodium chloride |
| 13 | 100.000 mM $Na_3$ citrate/citric acid pH: 5.5 | 10.000% w/v PEG-8000 | 200.000 mM $Li_2$ sulfate |
| 14 | 100.000 mM HEPES/NaOH pH: 7.5 | 10.000% w/v PEG-8000 | 200.000 mM $MgCl_2$ |
| 15 | 100.000 mM HEPES/NaOH pH: 7.5 | 20.000% w/v PEG-2000 MME | 200.000 mM NaCl |
| 16 | 100.000 mM MES/NaOH pH: 6. | 20.000% w/v PEG-2000 MME | 200.000 mM $ZnAc_2$ |
| 17 | 100.000 mM $Na_2$ H phosphate/K $H_2$ phosphate pH: 6.2 | 20.000% w/v PEG-2000 MME | 200.000 mM $Li_2$ sulfate |
| 18 | 100.000 mM acetic acid/NaAc pH: 4.5 | 20.000% w/v PEG-2000 MME | 200.000 mM $CaAc_2$ |
| 19 | 100.000 mM Tris base/HCl pH: 8.5 | 20.000% w/v PEG-2000 MME | 200.000 mM $MgCl_2$ |
| 20 | 100.000 mM cacodylic acid/Na cacodylate pH: 6.5 | 20.000% w/v PEG-2000 MME | 200.000 mM $Li_2$ sulfate |
| 21 | 100.000 mM HEPES/NaOH pH: 7.5 | 20.000% w/v PEG-2000 MME | 200.000 mM $Li_2$ sulfate |
| 22 | 100.000 mM Tris base/HCl pH: 8.5 | 20.000% v/v 1,4-butanediol | 200.000 mM $Li_2$ sulfate |
| 23 | 100.000 mM cacodylic acid/Na cacodylate pH: 6.5 | 20.000% v/v 1,4-butanediol | 200.000 mM $CaAc_2$ |
| 24 | 100.000 mM $Na_3$ citrate/citric acid pH: 5.5 | 20.000% v/v 1,4-butanediol | 200.000 mM $MgCl_2$ |
| (c) Crystallization Solution Set 3: | | | |
| 1 | 100.000 mM Tris base/HCl pH: 7. | 20.000% v/v 1,4-butanediol | 200.000 mM $ZnAc_2$ |
| 2 | 100.000 mM Tris base/HCl pH: 8.5 | 20.000% v/v 1,4-butanediol | 200.000 mM $MgCl_2$ |
| 3 | 100.000 mM $Na_3$ citrate/citric acid pH: 5.5 | 20.000% v/v 1,4-butanediol | 200.000 mM sodium chloride |
| 4 | 100.000 mM HEPES/NaOH pH: 7.5 | 20.000% w/v PEG-1000 | 200.000 mM sodium chloride |
| 5 | 100.000 mM MES/NaOH pH: 6 | 20.000% w/v PEG-1000 | 200.000 mM $ZnAc_2$ |
| 6 | 100.000 mM Tris base/HCl pH: 7. | 20.000% w/v PEG-1000 | 200.000 mM $Li_2$ sulfate |
| 7 | 100.000 mM HEPES/NaOH pH: 7.5 | 20.000% w/v PEG-1000 | 200.000 mM $MgCl_2$ |
| 8 | 100.000 mM MES/NaOH pH: 6. | 20.000% w/v PEG-1000 | 200.000 mM sodium chloride |
| 9 | 100.000 mM HEPES/NaOH pH: 7.5 | 2500.000 mM sodium chloride | |
| 10 | 100.000 mM MES/NaOH pH: 6. | 2500.000 mM sodium chloride | 200.000 mM $ZnAc_2$ |
| 11 | 100.000 mM Tris base/HCl pH: 8.5 | 2500.000 mM sodium chloride | 200.000 mM $Li_2$ sulfate |
| 12 | 100.000 mM cacodylic acid/Na cacodylate pH: 6.5 | 2500.000 mM sodium chloride | 200.000 mM $CaAc_2$ |
| 13 | 100.000 mM $Na_3$ citrate/citric acid pH: 5.5 | 2500.000 mM sodium chloride | 200.000 mM $MgCl_2$ |
| 14 | 100.000 mM cacodylic acid/Na cacodylate pH: 6.5 | 2500.000 mM sodium chloride | 200.000 mM $Li_2$ sulfate |
| 15 | 100.000 mM Tris base/HCl pH: 7. | 30.000% v/v PEG-400 | 200.000 mM $ZnAc_2$ |
| 16 | 100.000 mM imidazole/HCl pH: 8. | 30.000% v/v PEG-400 | 200.000 mM $Li_2$ sulfate |
| 17 | 100.000 mM $Na_3$ citrate/citric acid pH: 5.5 | 30.000% v/v PEG-400 | 200.000 mM $MgCl_2$ |
| 18 | 100.000 mM $Na_3$ citrate/citric acid pH: 5.5 | 30.000% v/v PEG-400 | 200.000 mM $Li_2$ sulfate |
| 19 | 100.000 mM imidazole/HCl pH: 8. | 30.000% v/v PEG-400 | 200.000 mM $ZnAc_2$ |
| 20 | 100.000 mM Tris base/HCl pH: 7. | 30.000% v/v PEG-400 | 200.000 mM NaCl |
| 21 | 100.000 mM $Na_2$ H phosphate/K $H_2$ phosphate pH: 6.2 | 15.000% v/v EtOH | 200.000 mM sodium chloride |
| 22 | 100.000 mM acetic acid/NaAc pH: 4.5 | 15.000% v/v EtOH | 200.000 mM $ZnAc_2$ |
| 23 | 100.000 mM cacodylic acid/Na cacodylate pH: 6.5 | 15.000% v/v EtOH | 200.000 mM $CaAc_2$ |
| 24 | 100.000 mM acetic acid/NaAc pH: 4.5 | 15.000% v/v EtOH | 200.000 mM $MgCl_2$ |
| (d) Crystallization Solution Set 4: | | | |
| 1 | 100.000 mM cacodylic acid/Na cacodylate pH: 6.5 | 15.000% v/v EtOH | 200.000 mM sodium chloride |
| 2 | 100.000 mM HEPES/HEPES pH: 7.5 | 10.000% w/v PEG-3000 | 200.000 mM sodium chloride |
| 3 | 100.000 mM MES/NaOH pH: 6. | 10.000% w/v PEG-3000 | 200.000 mM $ZnAc_2$ |
| 4 | 100.000 mM Tris base/HCl pH: 8.5 | 10.000% w/v PEG-3000 | 200.000 mM $CaAc_2$ |
| 5 | 100.000 mM $Na_3$ citrate/citric acid pH: 5.5 | 10.000% w/v PEG-3000 | 200.000 mM $MgCl_2$ |
| 6 | 100.000 mM Tris base/HCl pH: 8.5 | 10.000% w/v PEG-3000 | 200.000 mM $Li_2$ sulfate |
| 7 | 100.000 mM MES/NaOH pH: 6. | 10.000% w/v PEG-3000 | 200.000 mM $Li_2$ sulfate |
| 8 | 100.000 mM HEPES/HEPES pH: 7.5 | 1000.000 mM $(NH_4)_2$ H phosphate | 200.000 mM sodium chloride |
| 9 | 100.000 mM cacodylic acid/Na cacodylate pH: 6.5 | 1000.000 mM $(NH_4)_2$ H phosphate | 200.000 mM sodium chloride |
| 10 | 100.000 mM $Na_2$ H phosphate/K $H_2$ phosphate pH: 6.2 | 1260.000 mM $(NH_4)_2$ sulfate | 200.000 mM $Li_2$ sulfate |
| 11 | 100.000 mM Tris base/HCl pH: 7. | 1260.000 mM $(NH_4)_2$ sulfate | 200.000 mM $MgCl_2$ |
| 12 | 100.000 mM imidazole/HCl pH: 8. | 1260.000 mM $(NH_4)_2$ sulfate | 200.000 mM $Li_2$ sulfate |
| 13 | 100.000 mM $Na_3$ citrate/citric acid pH: 5.5 | 1260.000 mM $(NH_4)_2$ sulfate | 200.000 mM sodium chloride |
| 14 | 100.000 mM HEPES/HEPES pH: 7.5 | 20.000% w/v PEG-8000 | 200.000 mM sodium chloride |
| 15 | 100.000 mM Tris base/HCl pH: 7. | 20.000% w/v PEG-8000 | 200.000 mM $ZnAc_2$ |
| 16 | 100.000 mM imidazole/HCl pH: 8. | 20.000% w/v PEG-8000 | 200.000 mM $Li_2$ sulfate |

-continued

| Solution | Compound Buffer | Precipitant | Salt |
|---|---|---|---|
| 17 | 100.000 mM acetic acid/NaAc pH: 4.5 | 20.000% w/v PEG-8000 | 200.000 mM $MgCl_2$ |
| 18 | 100.000 mM cacodylic acid/Na cacodylate pH: 6.5 | 20.000% w/v PEG-8000 | 200.000 mM sodium chloride |
| 19 | 100.000 mM Tris base/HCl pH: 7. | 20.000% w/v PEG-8000 | 200.000 mM $MgCl_2$ |
| 20 | 100.000 mM HEPES/HEPES pH: 7.5 | 1000.000 mM $Na_3$ citrate | 200.000 mM sodium chloride |
| 21 | 100.000 mM MES/NaOH pH: 6. | 1000.000 mM $Na_3$ citrate | 200.000 mM $ZnAc_2$ |
| 22 | 100.000 mM imidazole/HCl pH: 8. | 1000.000 mM $Na_3$ citrate | 200.000 mM $Li_2$ sulfate |
| 23 | 100.000 mM acetic acid/NaAc pH: 4.5 | 1000.000 mM $Na_3$ citrate | 200.000 mM $MgCl_2$ |
| 24 | 100.000 mM Tris base/HCl pH: 8.5 | 1000.000 mM $Na_3$ citrate | 200.000 mM $Li_2$ sulfate |
| (e) Crystallization Solution Set 5: | | | |
| 1 | 100.000 mM MES/NaOH pH: 6. | 1000.000 mM $Na_3$ citrate | 200.000 mM $MgCl_2$ |
| 2 | 100.000 mM acetic acid/NaAc pH: 4.5 | 10.000% v/v isopropanol | 200.000 mM $Li_2$ sulfate |
| 3 | 100.000 mM $Na_3$ citrate/citric acid pH: 5.5 | 10.000% v/v isopropanol | 200.000 mM sodium chloride |
| 4 | 100.000 mM acetic acid/NaAc pH: 4.5 | 10.000% w/v PEG-8000 | 200.000 mM $MgCl_2$ |
| 5 | 100.000 mM Tris base/HCl pH: 8.5 | 10.000% w/v PEG-8000 | 200.000 mM sodium chloride |
| 6 | 100.000 mM acetic acid/NaAc pH: 4.5 | 20.000% w/v PEG-2000 MME | 200.000 mM $ZnAc_2$ |
| 7 | 100.000 mM Tris base/HCl pH: 8.5 | 20.000% w/v PEG-2000 MME | 200.000 mM $Li_2$ sulfate |
| 8 | 100.000 mM Tris base/HCl pH: 8.5 | 20.000% w/v 1,4-butanediol | 200.000 mM sodium chloride |
| 9 | 100.000 mM cacodylic acid/Na cacodylate pH: 6.5 | 20.000% w/v 1,4-butanediol | 200.000 mM $Li_2$ sulfate |
| 10 | 100.000 mM HEPES/NaOH pH: 7.5 | 20.000% w/v PEG-1000 | 200.000 mM $Li_2$ sulfate |
| 11 | 100.000 mM MES/NaOH pH: 6. | 20.000% w/v PEG-1000 | 200.000 mM $MgCl_2$ |
| 12 | 100.000 mM MES/NaOH pH: 6. | 2500.000 mM sodium chloride | 200.000 mM $Li_2$ sulfate |
| 13 | 100.000 mM Tris base/HCl pH: 8.5 | 30.000% w/v PEG-8000 | 200.000 mM $Li_2$ sulfate |
| 14 | 100.000 mM cacodylic acid/Na cacodylate pH: 6.5 | 30.000% w/v PEG-8000 | 200.000 mM $CaAc_2$ |
| 15 | 100.000 mM MES/NaOH pH: 6. | 30.000% w/v PEG-400 | 200.000 mM $MgCl_2$ |
| 16 | 100.000 mM Tris base/HCl pH: 7. | 30.000% w/v PEG-400 | 200.000 mM $Li_2$ sulfate |
| 17 | 100.000 mM HEPES/NaOH pH: 7.5 | 10.000% w/v PEG-3000 | 200.000 mM $Li_2$ sulfate |
| 18 | 100.000 mM MES/NaOH pH: 6. | 10.000% w/v PEG-3000 | 200.000 mM $MgCl_2$ |
| 19 | 100.000 mM imidazole/HCl pH: 8. | 1000.000 mM $Na_3$ citrate | 200.000 mM $MgCl_2$ |
| 20 | 100.000 mM Tris base/HCl pH: 8.5 | 1000.000 mM $Na_3$ citrate | 200.000 mM sodium chloride |
| 21 | 100.000 mM Tris base/HCl pH: 7. | 2500.000 mM NaMal | |
| 22 | 100.000 mM acetic acid/NaAc pH: 4.5 | 2500.000 mM NaMal | |
| 23 | 100.000 mM Tris base/HCl pH: 8.5 | 2500.000 mM NaMal | |
| 24 | 100.000 mM imidazole/HCl pH: 8. | 2500.000 mM NaMal. | |

13. The kit of claim 12 wherein the set of crystallization solutions comprises Crystallization Solution Set 1.

14. The kit of claim 12 wherein the set of crystallization solutions comprises Crystallization Solution Set 2.

15. The kit of claim 12 wherein the set of crystallization solutions comprises Crystallization Solution Set 3.

16. The kit of claim 12 wherein the set of crystallization solutions comprises Crystallization Solution Set 4.

17. The kit of claim 12 wherein the set of crystallization solutions comprises Crystallization Solution Set 5.

* * * * *

UNITED STATES PATENT AND TRADEMARK OFFICE
CERTIFICATE OF CORRECTION

PATENT NO.    : 6,599,441 B1
DATED         : July 29, 2003
INVENTOR(S)   : M.A. Chrislip et al.

It is certified that error appears in the above-identified patent and that said Letters Patent is hereby corrected as shown below:

Column 2,
Lines 40-41, "Set
            (s)" should not break

Column 7,
Line 9, Table 2 continued, line 12, [text in the Precipitant column] "200.00 mM $Li_2$" should read -- 200.000 mM $Li_2$ --

Column 14,
Line 13, "(see, e.g," should read -- (see, e.g., --

Column 20,
Line 17, Table (e), line 12, [text in the Precipitant column] "2500.000 nM sodium chloride" should read -- 2500.000 mM sodium chloride --
Line 67, "crys" should read -- crys- --

Signed and Sealed this

Sixteenth Day of December, 2003

JAMES E. ROGAN
*Director of the United States Patent and Trademark Office*